United States Patent [19]

Kabat et al.

[11] Patent Number: 5,191,514
[45] Date of Patent: Mar. 2, 1993

[54] PRINTED CIRCUIT CARD GUIDE WITH LOCKING HOOK

[75] Inventors: Zbigniew Kabat; Arcangel N. Capulong, both of Chicago, Ill.

[73] Assignee: AG Communication Systems Corporation, Phoenix, Ariz.

[21] Appl. No.: 803,848

[22] Filed: Dec. 9, 1991

[51] Int. Cl.$^5$ ............................................. H05K 7/14
[52] U.S. Cl. ..................................... 361/415; 361/391; 361/394; 361/412; 361/413; 439/327; 439/328; 439/377; 439/64; 211/41
[58] Field of Search ............... 361/391, 392, 393, 394, 361/397, 399, 412, 413, 415, 419, 427, 429; 439/64, 61, 62, 377, 328, 327; 211/41

[56] References Cited

U.S. PATENT DOCUMENTS

| | | | |
|---|---|---|---|
| 3,696,936 | 10/1972 | Straccia et al. | 211/41 |
| 3,829,741 | 8/1974 | Athey | 361/415 |
| 3,932,016 | 1/1976 | Ammenheuser | 439/377 |
| 3,939,382 | 2/1976 | Lacan et al. | 361/415 |
| 3,950,057 | 4/1976 | Calabro | 361/415 |
| 4,098,046 | 7/1978 | Papa | 211/41 |
| 4,109,300 | 8/1978 | Reimer | 361/415 |
| 4,861,277 | 8/1989 | Bina | 439/377 |

Primary Examiner—Leo P. Picard
Assistant Examiner—Young S. Whang
Attorney, Agent, or Firm—Anthony J. Baca

[57] ABSTRACT

The card guide with hook/card lock as disclosed is designed to prevent a printed circuit board (PCB) from being disengaged without first moving the mechanical card locking hook an adequate distance. When the mechanical card locking hook is flexed to disengage a PCB, the card lock will move only enough to allow the PCB to be disengaged and removed. The card guide has a built in fixed stop to prevent the extended card lock from deforming or breaking during disengagement of a PCB.

5 Claims, 3 Drawing Sheets

PRINTED CIRCUIT CARD GUIDE WITH LOCKING HOOK

FIELD OF THE INVENTION

The present invention relates to printed circuit cards. More specific, a plastic card guide with a locking hook that prevents a printed circuit board (PCB) assembly from being dislodged after it has been inserted in a card position.

BACKGROUND OF THE INVENTION

Today's large computing facility or telephone central office systems are generally constructed from several frames of equipment linked together by cables. Inside each frame can be a large number of individual printed circuit board arranged into functional groups. The functional groups are usually plugged into a common backplane that is attached to the frame. Card guides insure proper alignment of the individual PCBs and the backplane prior to the PCB mating with the backplane. Simple card guides can be found in most personal computer systems. However, in high reliable system, such as telephone systems, these simple card guides are not adequate.

An additional requirement for high reliable system, such as telephone systems, is the ability to prevent the PCB from coming lose during structural vibrations, yet be easily removed by the system administrator or repairperson. The card guides also must withstand repeated use without failure or fatigue.

Therefore it is the objective of the present invention to provide a locking card guide that prevents the unwanted removal of a printed circuit board while still allowing an intentional removal without significant hindrance.

SUMMARY OF THE INVENTION

In order to accomplish the object of the present invention there is provided a card guide with hook/card lock that is designed to prevent a printed circuit board (PCB) from being disengaged without first moving the mechanical card locking hook an adequate distance. When the mechanical card locking hook is flexed to disengage a PCB, the card lock will move only enough to allow the PCB to be disengaged and removed. The card guide has a built in fixed stop to prevent the extended card lock from deforming or breaking during disengagement of a PCB.

DESCRIPTION OF THE DRAWINGS

A better understanding of the invention may be had from the consideration of the following detailed description taken in conjunction with the accompanying drawings, in which.

DESCRIPTION OF THE PREFERRED EMBODIMENT

Figure 1:
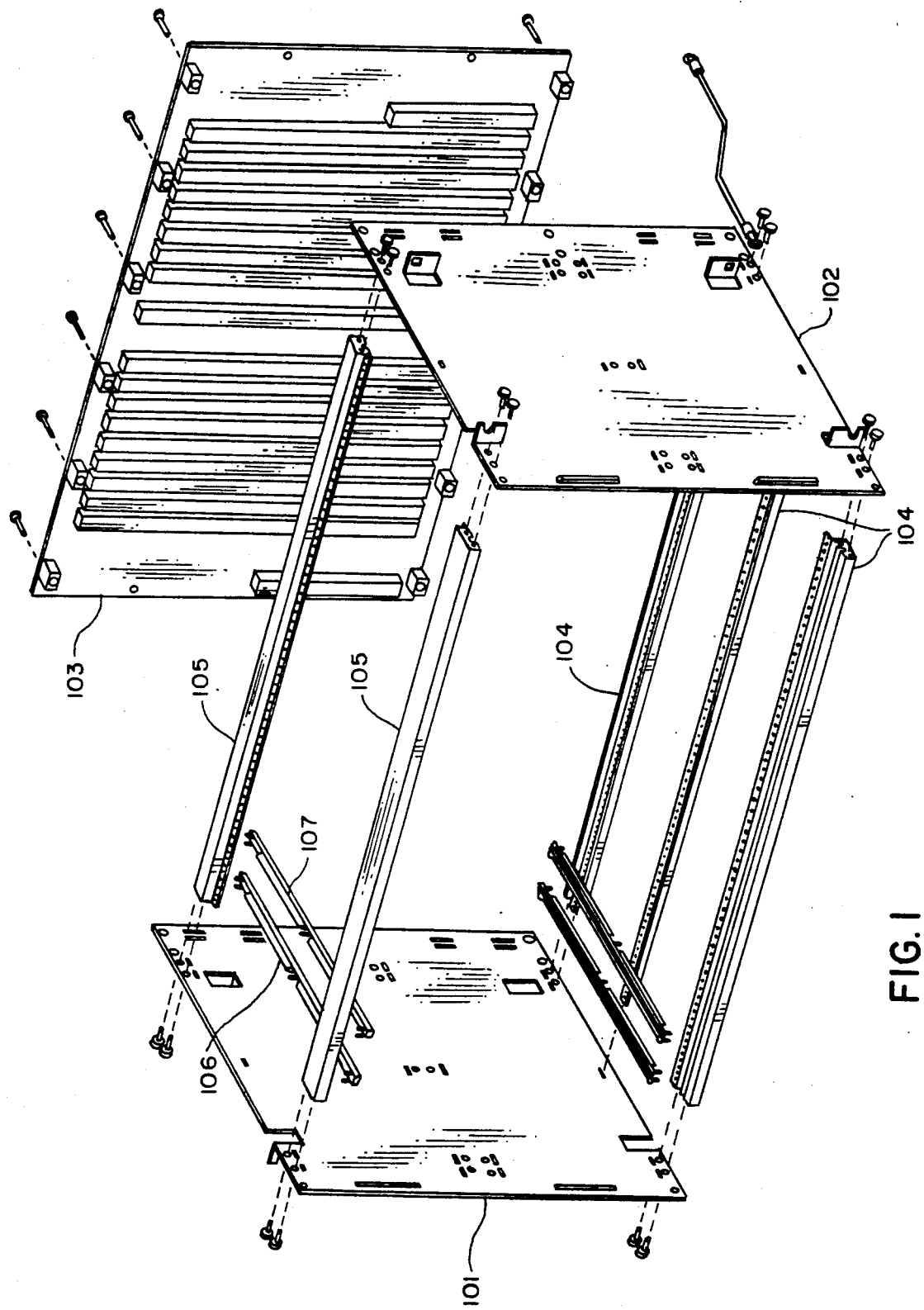
FIG. 1 shows a typical application of the present invention.

Referring first to FIG. 1 where a module of the type in which the present invention would generally be used is shown. The module is constructed from two END PLATES 101 and 102 and a BACKPLANE 103. The END PLATES 101 and 102 support TOP and BOTTOM SUPPORT MEMBERS 104 and 105 to which the CARD GUIDES 106 and 107 are attached. Note: in FIG. 1 only two card guides are shown, however, in a typical application card guides would extend across the support members. BACKPLANE 103 contains receptacles in which the individual cards plug into.

Figure 2:
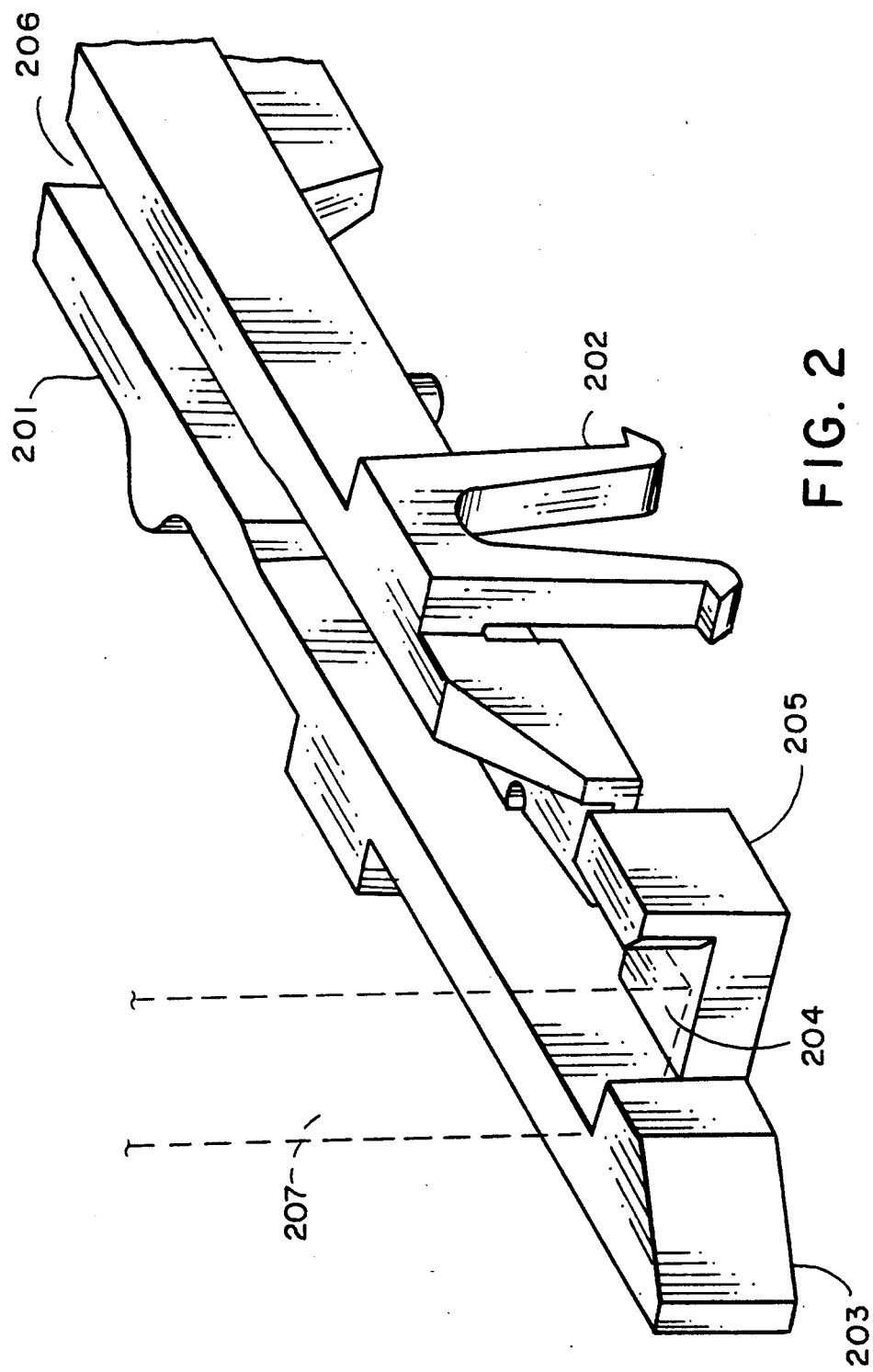
FIG. 2 is a perspective view of the present invention.

Referring next to FIG. 2, the present invention is shown in greater detail. Only the front of the CARD GUIDE 201 is shown here. From FIG. 2 the ANCHOR 202 can be seen, as well as, the LOCKING TAB 203 and TAB STOP 205. The ANCHOR 202 provides the mechanical connection between the CARD GUIDE 201 and the TOP and BOTTOM SUPPORT MEMBERS 104 and 105 of FIG. 1. In normal operation, the PCB is inserted through TAB CHANNEL 204 into CHANNEL 206 of CARD GUIDE 201. As the PCB slides into CHANNEL 206, LOCKING TAB 203 is forced in a lateral direction allowing TAB CHANNEL 204 and CHANNEL 206 to align. When the PCB fully mates with the backplane (not shown), the front of the PCB should just rest in TAB CHANNEL 204 such that LOCKING TAB 203 is in front of the PCB and holds the PCB in place. A ghosted image of a properly seated PCB 207 is shown in FIG. 2.

The LOCKING TAB 203 prevents PCB 207 from any significant movement along CHANNEL 206 thereby "locking in" PCB 207.

To extract the PCB from the card guide, the craftsperson must simultaneously push LOCKING TAB 203 laterally away from TAB STOP 205 while pulling PCB 207 longitudinally toward LOCKING TAB 203. Note however, that TAB STOP 205 will move with any movement of LOCKING TAB 203. The purpose of TAB STOP 205 is to prevent excess movement of LOCKING TAB 203 thereby preventing fatigue and early failure of the card guide LOCKING TAB 203. In the present embodiment, TAB STOP 205 allows only a 0.080" lateral movement of LOCKING TAB 203 at which point TAB STOP 205 makes contact with PCB 207, preventing any additional lateral movement of LOCKING TAB 203.

Figure 3:
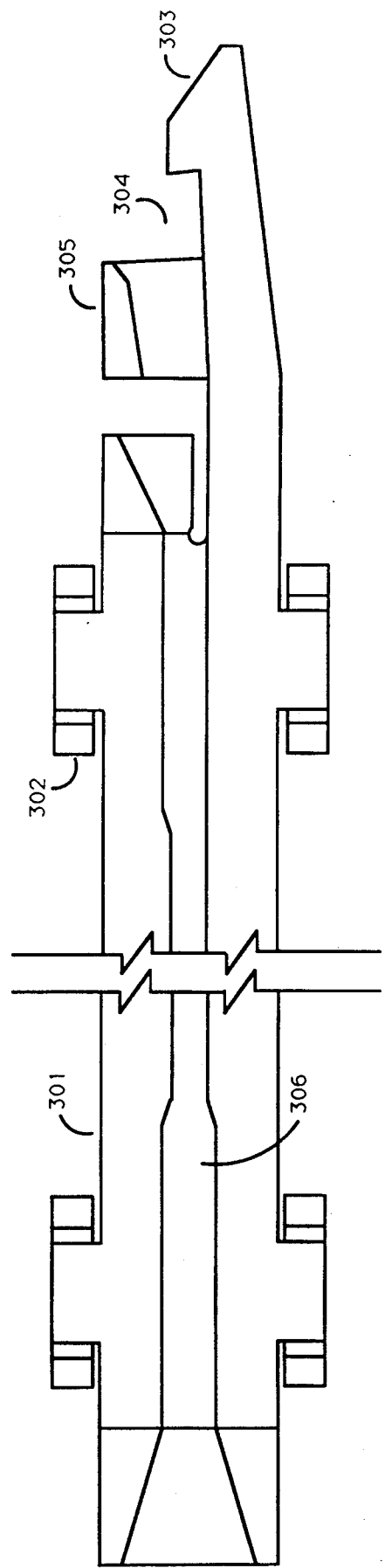
FIG. 3 is an overhead view of the present invention.

Referring briefly to FIG. 3, a top-down view of the present invention is given. In this particular figure the CARD GUIDE 301 is not shown in true proportion because the CARD GUIDE 301 is considerably longer than it is wide. From FIG. 3, the ANCHOR 302, LOCKING TAB 303, TAB CHANNEL 304, TAB STOP 305 and CHANNEL 306 can be seen.

The card guide must withstand repeated insertions and extractions of the PCB. For this reason, a plastic compound was chosen to make the card guide. While many plastic compounds will meet the requirements of the present invention, one compound in general has been found to provide acceptable results. In the present invention, the card guide is constructed of a light warm gray Lexan 500 plastic material with a V0 U1 Bul 94 flammability. The Lexan 500 has 10% glass with no regrind to maintain rigidity, impact strength and low mold shrinkage.

In summary, the card guide with hook/card lock is designed to prevent a printed circuit board from being disengaged without first moving the mechanical card locking hook an adequate distance (0.080" in the present embodiment). When the mechanical card locking hook is flexed to disengage a PCB, the card lock will move only enough to allow the PCB to be disengaged and removed. The card guide has a built in fixed stop to prevent the extended card lock from deforming or breaking during disengagement of a PCB.

Although the preferred embodiment of the invention has been illustrated, and that form described, it is readily apparent to those skilled in the art that various modifications may be made therein without departing from the spirit of the invention or from the scope of the appended claims.

What is claimed is:

1. A card guide for securing a printed circuit board, said card guide comprising:
   a first slot arranged to receive said printed circuit board when said printed circuit board is initially inserted into said card guide;
   a second slot arranged to receive said printed circuit board after said printed circuit board enters said first slot;
   a locking means arranged to prevent said printed circuit board from any longitudinal movement once said printed circuit board is fully inserted into said second slot, lateral movement being required to move said locking means thereby allowing said longitudinal movement of said printed circuit board; and
   a tab stop means arranged to limit said lateral movement of said locking means.

2. A card guide for securing a printed circuit board as claimed in claim 1, wherein said first slot being formed by said tab stop and said locking means.

3. A card guide for securing a printed circuit board, said card guide comprising:
   a slot arranged to receive said printed circuit board;
   a locking means for preventing said printed circuit board from being extracted when said printed circuit board is fully inserted in said slot, said locking means being defeated by a lateral force causing a lateral movement in said locking means; and
   a tab stop means arranged to limit said lateral movement of said locking means.

4. A card guide for securing a printed circuit board as claimed in claim 3, said slot comprising:
   a first slot arranged to receive said printed circuit board when said printed circuit board is initially inserted into said card guide; and
   a second slot arranged to receive said printed circuit board after said printed circuit board enters said first slot.

5. A card guide for securing a printed circuit board as claimed in claim 4, wherein said first slot being formed by said tab stop and said locking means.

* * * * *